United States Patent [19]
Kim et al.

[11] Patent Number: 6,091,663
[45] Date of Patent: Jul. 18, 2000

[54] SYNCHRONOUS BURST SEMICONDUCTOR MEMORY DEVICE WITH PARALLEL INPUT/OUTPUT DATA STROBE CLOCKS

[75] Inventors: Su-Chul Kim; Hak-Soo Yu, both of Seoul; Min-Chul Chung, Kyunggi-do, all of Rep. of Korea

[73] Assignee: Samsung Electronics Co., Ltd., Rep. of Korea

[21] Appl. No.: 09/137,645

[22] Filed: Aug. 20, 1998

[30] Foreign Application Priority Data

Sep. 4, 1997 [KR] Rep. of Korea ............ 97-45860

[51] Int. Cl.⁷ .................................................. G11C 8/00
[52] U.S. Cl. ............................ 365/233; 365/238.5
[58] Field of Search .................... 365/233, 238.5, 365/191, 194, 189.05

[56] References Cited

U.S. PATENT DOCUMENTS

| | | | |
|---|---|---|---|
| 5,327,390 | 7/1994 | Takasugi | 365/230.06 |
| 5,402,389 | 3/1995 | Flannagan et al. | 365/233 |
| 5,668,773 | 9/1997 | Zagar et al. | 365/233 |
| 5,726,950 | 3/1998 | Okamoto et al. | 365/233 |
| 5,740,121 | 4/1998 | Suzuki et al. | 365/233 |

*Primary Examiner*—Son Mai
*Attorney, Agent, or Firm*—Samuels, Gauthier & Stevens LLP

[57] ABSTRACT

A synchronous burst semiconductor memory device operating in synchronism with at least one external clock signal and capable of accessing data on every edge of the external clock signal is provided. The burst memory device includes a clock generator for generating a number of data output/input strobe clock signals synchronized with the external clock signal in response to a plurality of input information signals, and a data-out/in buffer for outputting/inputting internal/external data in synchronism with the data output/input strobe clock signals.

32 Claims, 9 Drawing Sheets

SYNCHRONOUS BURST SEMICONDUCTOR MEMORY DEVICE WITH PARALLEL INPUT/OUTPUT DATA STROBE CLOCKS

FIELD OF THE INVENTION

The present invention generally relates to semiconductor random access memory devices operating in synchronism with at least one external clock signal and, more particularly, to an internal clock generator suitable for synchronous burst memory devices with a mode of operation in which each data word is driven in synchronism with every edge of an external clock signal.

BACKGROUND OF THE INVENTION

A semiconductor memory device is usually used to provide data storage for a microprocessor. Historically, semiconductor memory devices have been controlled asynchronously by the processor. That is, a microprocessor typically applies addresses to inputs of a memory device and strobes them by using the RAS (row address strobe) and CAS (column address strobe) pins. The addresses are held for a required minimum length of time. During this time the memory device accesses its addressed locations and after a maximum delay either writes new data from the processor into its locations or provides data from the locations to its outputs for the processor to read. During this time, the processor must wait for the memory device to perform various internal functions such as precharging the lines, decoding the addresses, sensing the data, and routing the data out through the output buffers. This creates a "wait state" during which the high speed processor is waiting for the memory device to respond, thereby slowing down the entire system.

Calculation speeds in processors have improved. As a result, there is an increasing demand for semiconductor memory devices with increased access speed. However, the process technologies presently available and the relatively large chip sizes of ultra large scale integration circuits limit the access speeds of memory devices.

To improve the bandwidth of semiconductor memories, several architectures have been used. One common approach is the synchronous interface architecture. Making memories synchronous puts them under the control of the system clock. Synchronous memories use input and output latches for holding the memory data. Input latches can store the addresses, data, and control signals on the inputs of a memory device. After a preset number of clock cycles, the data can be available on the output latches of the memory device with synchronous control for a read from the memory or a write to the memory. Synchronous control means that the memory device latches information from the processor in and out under the control of the system clock. Since the number of clock cycles required for the memory to complete its task is predetermined, the processor can safely perform other tasks while the memory is processing its requests. A major advantage of synchronous control is that the system clock edge is the only timing strobe that must be provided by the system to the memory. This reduces the need to propagate multiple timing strobes around the printed circuit board or module.

While memory devices are making significant gains in speed and bandwidth, there still remains a gap in the speed requirements of the processors. The solution for providing adequate memory bandwidth depends on the system architecture, the application requirements and the processor, all of which help determine the memory type to be used in a particular application.

An approach for increasing the speed and the bandwidth is the burst access technique. The burst access allows the internal timing delay components to be decreased. According to this technique, for example, active read/write command and precharge time can be hidden after the first access. In a burst memory, following an initial address input, subsequent addresses are internally generated in rapid succession without inputting new address information to the burst memory. Thus, a series of burst data words currently on the sense amplifiers can be clocked out rapidly following the access of the first data word. These burst mode accesses take advantage of the fact that the internal bus of the memory device is wider than the external bus. This permits all of the data from a series of burst mode addresses to be fetched from the burst memory device to its outputs upon the entry of the initial address.

Another approach for increasing the speed and the bandwidth is described in a paper from "Symposium on VLSI Circuit Digest of Technical Papers," published in June, 1992, pages 66–67, by Kushiyama, N., et al., entitled, "500 Mbyte/sec Data Rate 512 Kbits×9 DRAM Using a Novel I/O Interface." The synchronous memory device described therein accesses data in response to both rising and falling edges of an external clock signal, thus doubling the data rate of the memory device. The double data rate memory overcomes the limitation of a single data rate memory. During a double data rate read operation of the memory device, addresses are registered at the first rising edge of external clock, and the internal array latches data of twice the external data length. During the next cycle, data are driven to the external data bus sequentially on both rising and falling clock edges.

To assure input/output synchronization, many double data rate memories use complementary input/output strobe clocks synchronized with the data output. See, for example, U.S. Pat. No. 5,513,327, entitled, "Integrated Circuit I/O Using A High Performance Bus Interface," issued to Farmwald et al. on Apr. 30, 1996 and ISSCC Digest of Technical Papers, pages 378–379, February, 1996, entitled, "A 32-Bank 1Gb DRAM with 1GB/s Bandwidth," by Yoo, J. H., et al.

The conventional input/output data strobe clock generation schemes, however, may not adapt to the transition between the single and double data rate modes and the variation of the burst length during the time that a burst read or write operation is being performed.

SUMMARY OF THE INVENTION

It is therefore an object of the present invention to provide a synchronous burst semiconductor memory device with an input/output data strobe clock generator adaptively generating input/output strobe clocks depending upon the burst length.

It is another object of the present invention to provide a synchronous burst semiconductor memory device with an input/output data strobe clock generator adaptively generating input/output strobe clocks depending upon the input/output data rate.

It is another object of the present invention to provide a synchronous burst semiconductor memory device with a double data rate mode, which provides a timing margin of the double data rate mode that is almost equivalent to that of a single data rate mode.

According to an aspect of the present invention, a synchronous burst semiconductor memory device operating in synchronism with at least one external clock signal and capable of accessing data on every edge of the external clock signal is provided. The burst memory device includes a clock generator for generating a number of output strobe clock signals synchronized with the external clock signal in response to a plurality of input information signals. A data buffer outputs internal data in synchronism with the output strobe clock signals.

The output strobe clock signals become activated in turn in a first data rate or single data rate (SDR) mode where each data word is driven in synchronism with every rising/falling edge of the external clock signal and a second data rate or double data rate (DDR) mode where each data word is driven in synchronism with every edge of the external clock signal. The number of the activated output strobe clock signals depends on a burst length of a burst read operation.

According to another aspect of the present invention, a synchronous burst semiconductor memory device operating in synchronism with at least one external clock signal includes a clock generator for generating a number of input strobe clock signals synchronized with the external clock signal in response to a plurality of input information signals. A data buffer inputs external data in synchronism with the input strobe clock signals.

In this aspect, the input strobe clock signals become activated in turn in an SDR mode and a DDR mode. The number of the activated input strobe clock signals depends on a burst length of a burst write operation.

According to another aspect of the present invention, a synchronous burst semiconductor memory device operating in synchronism with a pair of external clock signals being complementary to each other includes a clock generator for generating a number of output strobe clock signals and a number of input strobe clock signals synchronized with the external clock signals in response to a plurality of input information signals. A first data buffer outputs internal data in synchronism with the output strobe clock signals, and a second data buffer inputs external data in synchronism with the input strobe clock signals.

In this aspect of the invention, the output and input strobe clock signals become activated in turn in an SDR mode and a DDR mode. The number of the activated output/input strobe clock signals depends on a burst length of a burst read/write operation.

According to another aspect of the present invention, a synchronous burst semiconductor memory device operating in synchronism with a pair of first and second external clock signals being complementary to each other includes a clock edge detector, a burst access type controller, a clock enable signal generator, first and second decoders, first and second clock drivers, a data-out buffer, and a data-in buffer. The clock edge detector detects rising/falling edges of the first and second external clock signals and generates first and second detection signals. The burst access type controller generates first and third access type control signals in response to external access type input signals. The first through third access type signals indicate a read enable period, a write enable period and a burst continue period, respectively. The data rate controller generates first and second data rate signals in response to an external data rate input. The clock enable signal generator generates a plurality of first clock enable signals for an SDR mode and a plurality of second clock enable signals for a DDR mode in response to the detection signals, the access type signals and the data rate signals. The first and second clock enable signals become activated in turn depending on a burst length of either a burst read operation or a burst write operation. The first decoder decodes the first control signal, the first clock enable signals, and the second clock enable signals and generates a number of first decoding signals for the SDR mode and a number of second decoding signals for the DDR mode. The first and second decoding signals become activated by turn. The numbers of the first and second decoding signals are determined by the burst length of the burst read operation. The first clock driver generates a number of first strobe clock signals in response to the first and second detection signals, the first decoding signals and the second decoding signals. The first strobe clock signals become activated in turn. The number of the activated output strobe clock signals is determined by the burst length of the burst read operation. The data-out buffer outputs internal data in synchronism with the first strobe clock signals. The second decoder decodes the second control signal, the first clock enable signals and the second clock enable signals and generates a number of third decoding signals for the SDR mode and a number of fourth decoding signals for the DDR mode. The third and fourth decoding signals become activated in turn. The numbers of the third and fourth decoding signals are determined by the burst length of the burst write operation. The second clock driver generates a number of second strobe clock signals in response to the first and second detection signals, the third decoding signals and the fourth decoding signals. The second strobe clock signals become activated in turn. The number of the activated input strobe clock signal is determined by the burst length of the burst write operation. The data-in buffer inputs external data in synchronism with the second strobe clock signals. The clock enable signal generator can be implemented with a plurality of switch elements and a plurality of signal latches. The each of the first and second decoders can be implemented with a plurality of logic gates.

According to the synchronous burst semiconductor memory device of the invention, data-in and/or data-out buffer is adaptively clocked depending upon the burst length. Further, input/output data strobe clocks are adaptively generated depending upon the input/output data rate. Further, a sufficient timing margin in the double data rate mode can be acquired.

BRIEF DESCRIPTION OF THE DRAWINGS

The foregoing and other objects, features, and advantages of the invention will be apparent from the following more particular description of preferred embodiments of the invention, as illustrated in the accompanying drawings, in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Preferred embodiments of the present invention will now be described in detail with reference to the accompanying drawings. It is noted that various kinds of semiconductor memory devices, such as a static RAM, a dynamic RAM, a masked ROM, a flash EEPROM, a ferroelectric RAM, or other such device, can be used to implement the inventive concept of the presently disclosed embodiment. In the following description of preferred embodiments of the present invention, data stored in a memory cell is accessed in synchronism with the system clock which operates as a reference clock. In accordance with the invention, parallel data input/output strobe clocks are generated such that the cycle time limit can be reduced during double data rate modes.

Figure 1:
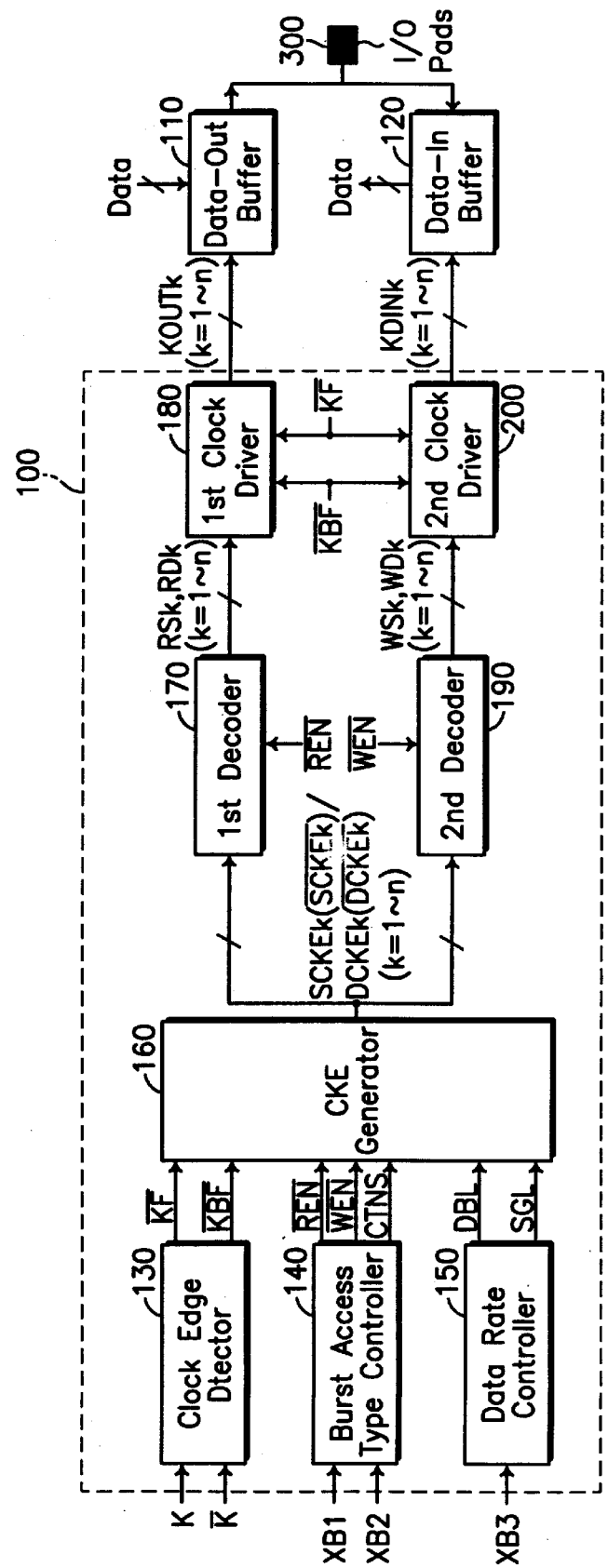
FIG. 1 is a schematic block diagram illustrating an embodiment of an input/output strobe clock generator useful for a synchronous burst semiconductor memory device according to the present invention.

Reference is now made to FIG. 1, which is a block diagram illustrating an embodiment of an input/output strobe clock generator for a synchronous burst semiconductor memory device according to the present invention. The synchronous burst semiconductor memory device of the invention operates in synchronism with a pair of complementary external clock signals K and $\overline{K}$.

The memory device can access data on every edge of the external clock signals K and $\overline{K}$. The memory device includes an internal strobe clock generator 100 which receives the external clock signals K and $\overline{K}$ and external control signals XB1, XB2 and XB3, and internally generates a number of data output strobe clock signals KOUT1, KOUT2, . . . , and KOUTn and a number of data input strobe clock signals KDIN1, KDIN2, . . . , and KDINn in synchronism with the external clock signals K and $\overline{K}$, where n is a positive integer. The memory device further includes a data-out buffer 110 and a data-in buffer 120. The data-out buffer 110 outputs internal data to I/O pads (or pins) 300 in synchronism with the data output strobe clock signals KOUTk (k=1, 2, . . . , and n). The data-in buffer 120 inputs external data from the I/O pads 300 in synchronism with the data input strobe clock signals KDINk (k=1, 2, . . . , and n).

The internal strobe clock generator 100 includes a clock edge detector 130, a burst access type controller 140, a data rate controller 150, a clock enable (CKE) signal generator 160, a first decoder 170, a first clock driver 180, a second decoder 190, and a second clock driver 200. The clock edge detector 130 detects the rising (or falling) edge of the external clock signal K and generates a first detection signal $\overline{KF}$ of active low logic level. The clock edge detector 130 also detects the rising (or falling) edge of the external clock signal $\overline{K}$ and generates a second detection signal $\overline{KBF}$ of active low logic level. The first and second detection signals $\overline{KF}$ and $\overline{KBF}$ are short pulses (See FIGS. 8 and 9).

The burst access type controller 140 generates the first and third access type control signals $\overline{REN}$, $\overline{WEN}$, and CTNS in response to the external access type input signals XB1 and XB2. The first through third access type signals $\overline{REN}$, $\overline{WEN}$, and CTNS indicate a read enable period, a write enable period, and a burst continue period, respectively.

The data rate controller 150 generates the first and second data rate signals DBL and SGL in response to the external data rate input XB3. The first data rate signal DBL indicates the double data rate (DDR) mode in which each data word is driven in synchronism with every edge of the external clock signals K and $\overline{K}$, and the second data rate signal SGL indicates the signal data rate (SDR) mode in which each data word is driven in synchronism with every rising (or falling) edge of the external clock signals. The CKE signal generator 160 generates a plurality of first clock enable signals $\overline{SCKE1}$, $\overline{SCKE2}$, . . . , and $\overline{SCKEn}$ for the SDR mode and a plurality of second clock enable signals $\overline{DCKE1}$, ,. $\overline{DCKE2}$. . , and $\overline{DCKEn}$ for the DDR mode, in response to the detection signals $\overline{KF}$ and $\overline{KBF}$, the access type signals $\overline{REN}$, $\overline{WEN}$ and CTNS and the data rate signals DBL and SGL.

The first decoder 170 decodes the first access type control signal (i.e., read enable signal) $\overline{REN}$, the first clock enable signals $\overline{SCKE1}$–$\overline{SCKEn}$ and the second clock enable signals $\overline{DCKE1}$–$\overline{DCKEn}$, and generates a number of first decoding signals RS1, RS2, . . . , and RSn for the SDR mode and a number of second decoding signals RD1, RD2, . . . , and RDn for the DDR mode. The first decoding signals RS1–RSn become activated in turn. The second decoding signals RD1–RDn also become activated in turn. The respective numbers of the first and second decoding signals depend on the burst length of the burst read operation. The first clock driver 180 generates the data output strobe clock signals KOUT1, KOUT2, . . . , KOUTn in response to the first and second detection signals $\overline{KF}$ and $\overline{KBF}$, the first decoding signals RS1–RSn and the second decoding signals RD1–RDn. The strobe clock signals KOUT1–KOUTn become activated in turn. The internal data are outputted in synchronism with the strobe clock signals KOUT1–KOUTn via the data-out buffer 110 to the I/O pads 300. The number of the activated strobe clock signals KOUT1–KOUTn depends on a burst length of a burst read operation.

The second decoder 190 decodes the second control signal (i.e., write enable signal) $\overline{WEN}$, the first clock enable signals $\overline{SCKE1}$–$\overline{SCKEn}$ and the second clock enable signals $\overline{DCKE1}$–$\overline{DCKEn}$, and generates a number of third decoding signals WS1, WS2, . . . , and WSn for the SDR mode and a number of fourth decoding signals WD1, WD2, . . . , and WDn for the DDR mode. The third and fourth decoding signals WS1–WSn and WD1–WDn become activated in turn, respectively. The respective numbers of the third and fourth decoding signals depend on the burst length of the burst write operation. The second clock driver 200 generates the data input strobe clock signals KDIN1, KDIN2, . . . , KDINn. The strobe clock signals KDIN1–KDINn become activated in turn. The external data from the I/O pads 300 are inputted in synchronism with the strobe clock signals KDIN1–KDINn through the data-in buffer 120. The number of the activated strobe clock signals KDIN1–KDINn depends on a burst length of a burst write operation.

Figure 2:
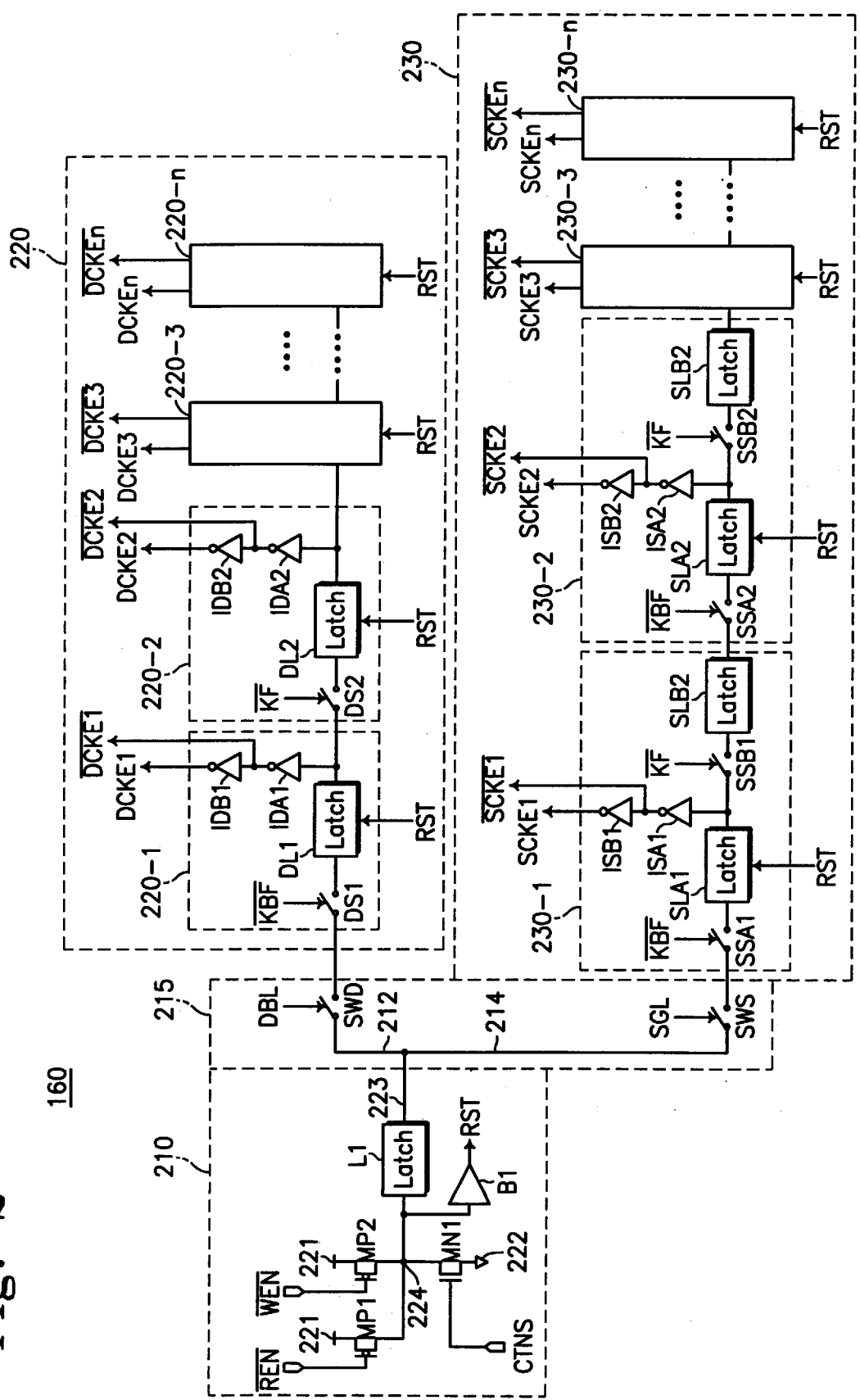
FIG. 2 is a schematic detailed circuit diagram of the clock enable signal generator of FIG. 1.

Referring to FIG. 2, a detailed circuit construction of the CKE signal generator 160 is illustrated. The CKE signal generator 160 includes a level driver 210, a path selector 215, a first DRM (Data Rate Mode)-CKE signal generator 220, and a second DRM-CKE signal generator 230. The level driver 210 includes first and second P-channel pull-up MOS transistors MP1 and MP2, an N-channel pull-down MOS transistor MN1, a latch L1, and a buffer B1. The first pull-up transistor MP1 has a source-drain conduction path (or channel) coupled between a power supply voltage 221 and a node 224, and a gate coupled to the read enable signal $\overline{REN}$ from the burst access type controller 140. The first pull-up transistor MP1 is turned on/off in response to the read enable signal $\overline{REN}$. The second pull-up transistor MP2 has a source-drain conduction path coupled between the power supply voltage 221 and the node 224, and a gate coupled to the write enable signal $\overline{WEN}$ from the burst access type controller 140. The second pull-up transistor MP2 is turned on/off in response to the write enable signal $\overline{WEN}$. The pull-down transistor MN1 has a source-drain conduction path coupled between the node 224 and ground voltage 222, and a gate coupled to the burst continue signal CTNS from the burst access type controller 140. The first pull-down transistor MN1 is turned on/off in response to the burst continue signal CTNS. The latch L1 has an input coupled to the node 224 and an output 223 commonly coupled to the paths 212 and 214. The latch L1 latches a voltage level on the node 222. The buffer B1 has an input coupled to the node 224 and generates a reset signal RST after a burst read/write operation of a given burst length has been completed.

The path selector 215 includes two switches SWD and SWS. One switch SWD is disposed on the path 212 for the DDR mode and the other switch SWS on the path 214 for the SDR mode. The switch SWD is controlled by the first data rate signal DBL from the data rate controller 150. The switch SWS is controlled by the second data rate signal SGL from the data rate controller 150. The switch SWD is closed in DDR mode while the switch SWS is closed in SDR mode.

The first DRM-CKE signal generator 220 includes n latch circuits 220-1, 220-2, ..., 220-n. As can be seen in FIG. 2, each latch circuit 220-k includes a switch DSk, a latch DLk, and two inverters IDAk and IDBk, where k=1, 2, ..., or n. Each latch circuit 220-k generates a pair of double DRM-CKE signals DCKEk and $\overline{DCKEk}$. For example, latch circuit 220-1 generates the signals DCKE1 and $\overline{DCKE1}$, and latch circuit 220-n generates the signals DCKEn and $\overline{DCKEn}$. The respective switches DS1, DS3, DS5, ..., within the odd-numbered latch circuits 220-1, 220-3, 220-5 ... are controlled by the detection signal $\overline{KBF}$, and the respective switches DS2, DS4, DS6, ... within the even-numbered latch circuits 220-2, 220-4, 220-6 ... by the detection signal $\overline{KF}$. The latches DL1, DL2, ..., DLn are reset by the signal RST from the buffer B1 when a burst read/write operation begins.

The second DRM-CKE signal generator 230 includes n latch circuits 230-1, 230-2, ..., 230-n. As can be seen, each latch circuit 230-k includes two switches SSAk and SSBk, two latches SLAk and SLBk, and two inverters ISAk and ISBk, where k=1, 2, ..., or n. Each latch circuit 230-k generates a pair of single DRM-CKE signals SCKEk and $\overline{SCKEk}$. For example, latch circuit 230-1 generates the signals SCKE1 and $\overline{SCKE1}$, and latch circuit 230-n generates the signals SCKEn and $\overline{SCKEn}$. The switches SSA1, SSA2, SSA3, ..., and SSAn are controlled by the detection signal $\overline{KBF}$, while the switches SSB1, SSB2, ..., and SSBn are controlled by the detection signal $\overline{KF}$. The latches SLA1, SLA2, ..., SLAn are also reset by the signal RST from the buffer B1 when a burst read/write operation begins.

Figure 8:
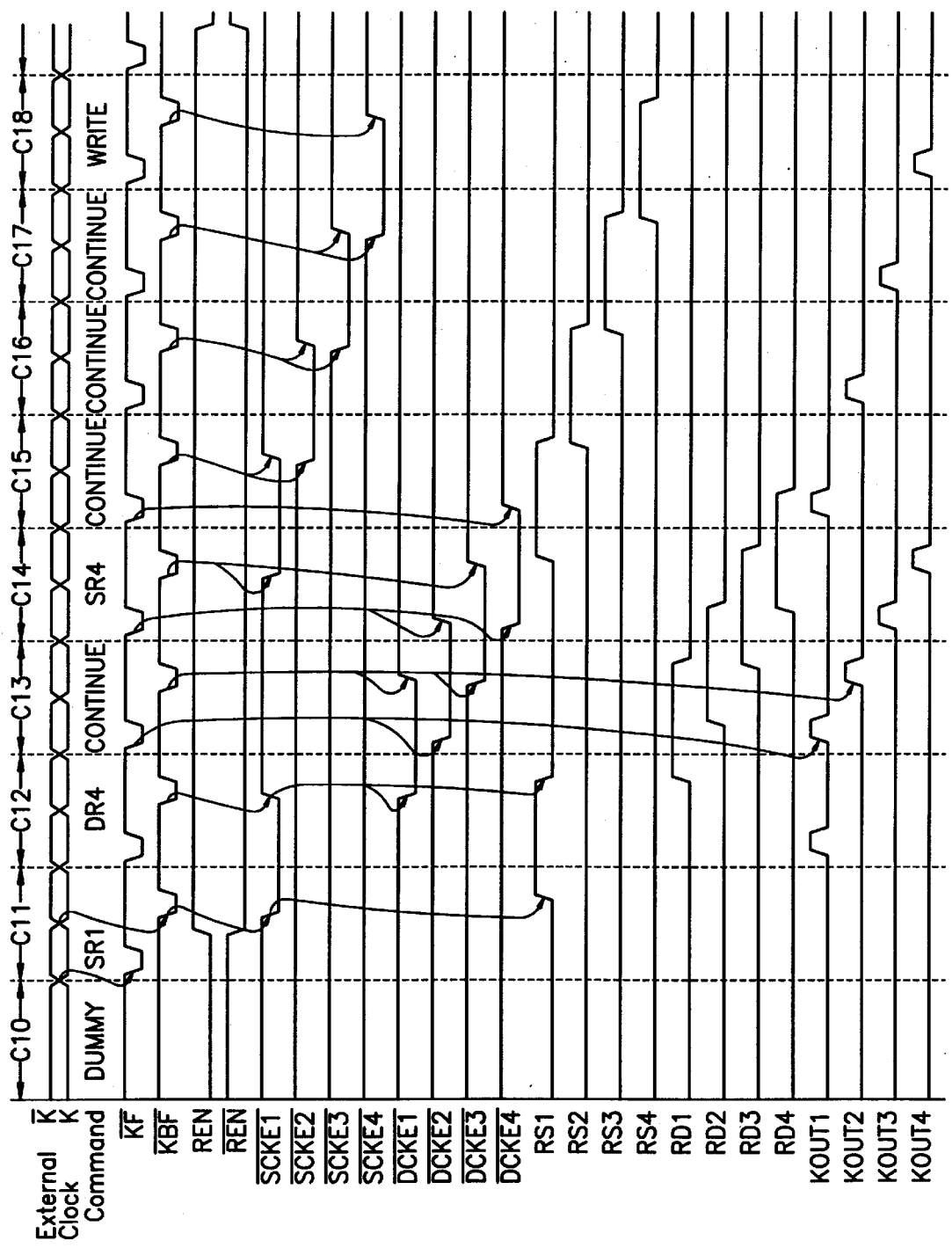
FIG. 8 is a schematic timing diagram of a single/double burst read operation of one embodiment of the memory device according to the invention.
Figure 9:
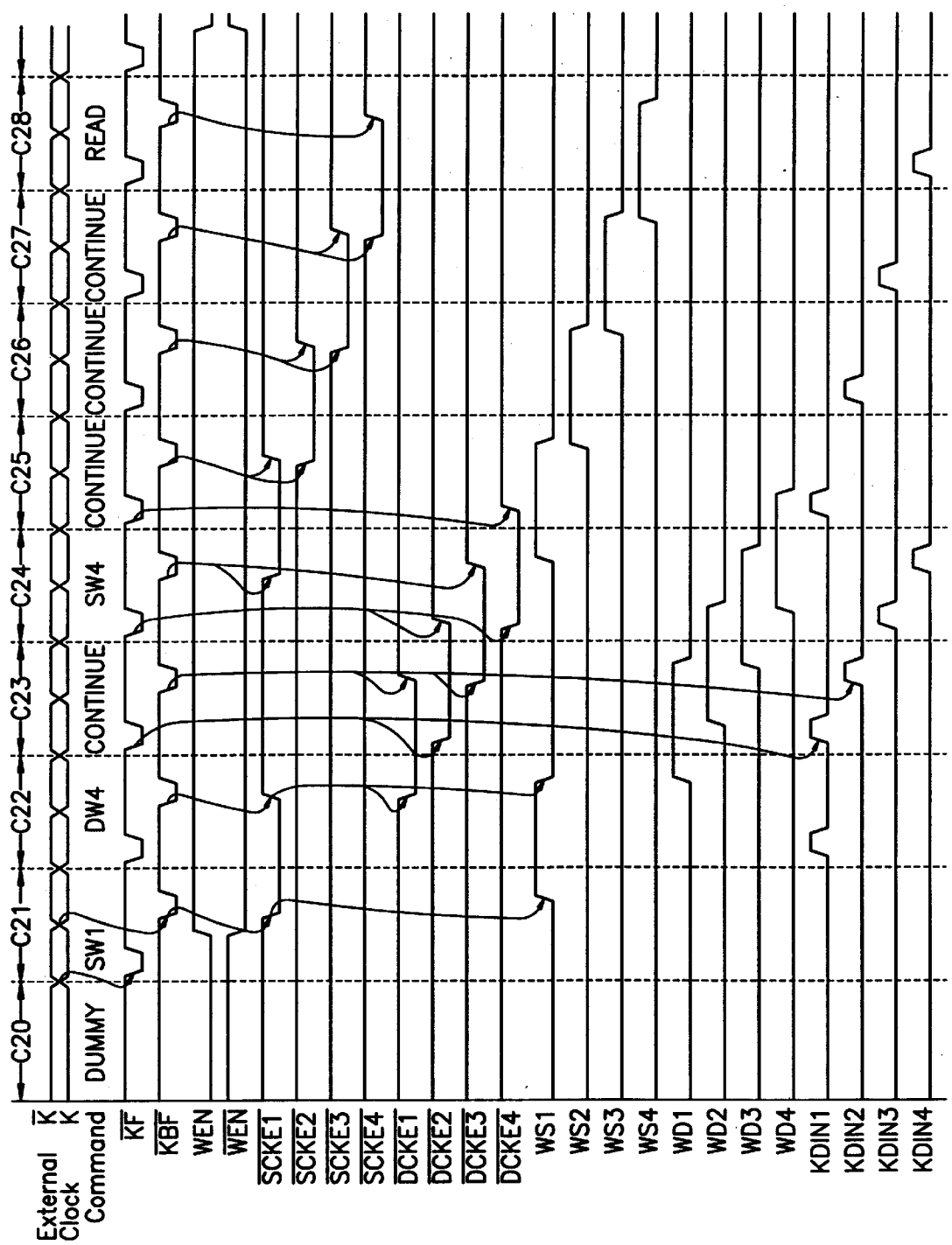
FIG. 9 is a schematic timing diagram of a single/double burst write operation of one embodiment of the memory device according to the invention.

The timing relationship among the signals K, $\overline{K}$, $\overline{KF}$, $\overline{KBF}$, $\overline{REN}$, $\overline{WEN}$, $\overline{DCKE1-DCKEn}$, and $\overline{SCKE1-SCKEn}$ is illustrated in FIGS. 8 and 9, which are timing diagrams of single/double burst read and write operations of the memory device according to one embodiment. It can be seen in FIGS. 8 and 9 that the timing relationship depends on the burst length and the data rate mode.

Referring to FIGS. 2, 8 and 9, in cycle C11 or C21 where an SDR burst read/write command with burst length 1 (SR1) is issued, when the read or write enable signal $\overline{REN}/\overline{WEN}$ becomes activated during burst access mode, one of the transistors MP1 and MP2 is turned on. At this time, the latches DL1–DLn and SLA1–SLAn are reset by the signal RST from the buffer B1. Then, the latch L1 has an output of high level and the switch SWS is closed by the signal SGL. When the $\overline{KBF}$ becomes activated, the latch SLA1 latches the output of the latch L1 and thus the clock enable signal $\overline{SCKE1}$ goes low.

In cycle C12 or C22, in which a DDR burst read/write command of burst length 4 (DR4) is given, the latches DL1–DLn and SLA1–SLAn are reset by the signal RST and the latch L1 provides a high level output. In this DDR mode, the switch SWD is closed by the signal DBL. When the $\overline{KBF}$ becomes activated and the switch DS1 is closed, the latch DL1 latches the output of the latch L1 and thus the clock enable signal $\overline{DCKE1}$ goes low.

In cycle C13 or C23, in which a burst continue command is issued, the transistor MN1 is turned on and thus the latch L1 provides the output at low level. When the $\overline{KF}$ becomes activated and the switch DS2 is closed, the output of the latch DL1 is transferred to the latch DL2 via switch DS2 and thus the clock enable signal $\overline{DCKE2}$ goes low. When the $\overline{KBF}$ becomes activated, the latch SLA1 latches the output of the latch L1 and thus the clock enable signal $\overline{SCKE1}$ goes high. Like this, the signals $\overline{DCKE3}$ and $\overline{DCKE4}$ for the DDR mode become activated in sequence.

If a single read/write command of burst length 4 (SR4/SW4) is issued in cycle C14 or C24, the signals $\overline{SCKE1}$, $\overline{SCKE2}$, $\overline{SCKE3}$ and $\overline{SCKE4}$ for the SDR mode become activated by turn in order.

Figure 3:
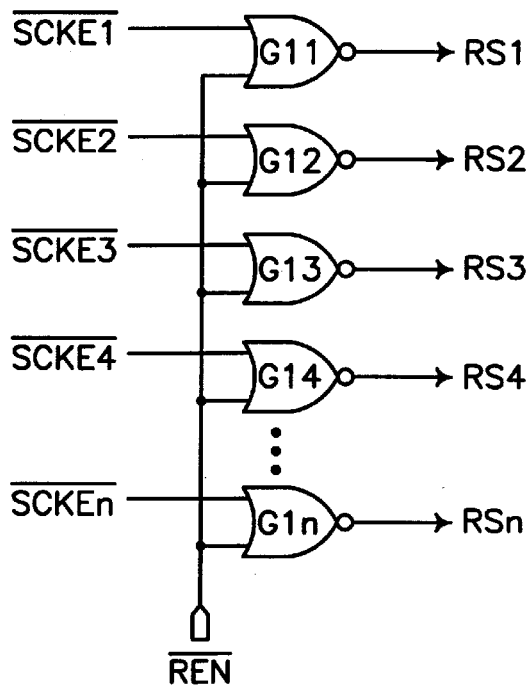
FIG. 3 is a schematic detailed circuit diagram of the first decoder of FIG. 1.
Figure 3:
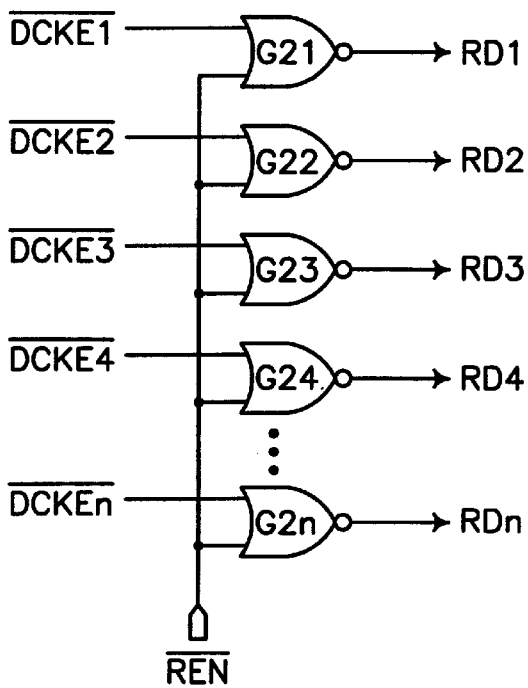

Referring to FIG. 3, a detailed circuit construction of the first decoder 170 according to one embodiment of the invention is illustrated. The decoder 170 includes a first group of NOR gates G11, G12, ..., and G1n and a second group of NOR gates G21, G22, ..., and G2n. First inputs of the NOR gates G11, G12, ..., and G1n are commonly coupled to the read enable signal $\overline{REN}$ and second inputs thereof are coupled to the clock enable signals $\overline{SCKE1-SCKEn}$, respectively. The NOR gates G11, G12, ..., and G1n perform logical function of the signals $\overline{REN}$ and $\overline{SCKE1-SCKEn}$ and generate logical outputs RS1, RS2, ..., and RSn as the decoding signals for the SDR burst read operation. First inputs of the NOR gates G21, G22, ..., and G2n are also commonly coupled to the read enable signal $\overline{REN}$ and second inputs thereof are coupled to the clock enable signals $\overline{DCKE1-DCKEn}$, respectively. The NOR gates G21, G22, ..., and G2n perform logical function of the signals $\overline{REN}$ and $\overline{DCKE1-DCKEn}$ and generate logical outputs RD1, RD2, ..., and RDn as the decoding signals for the DDR burst read operation.

Figure 4:
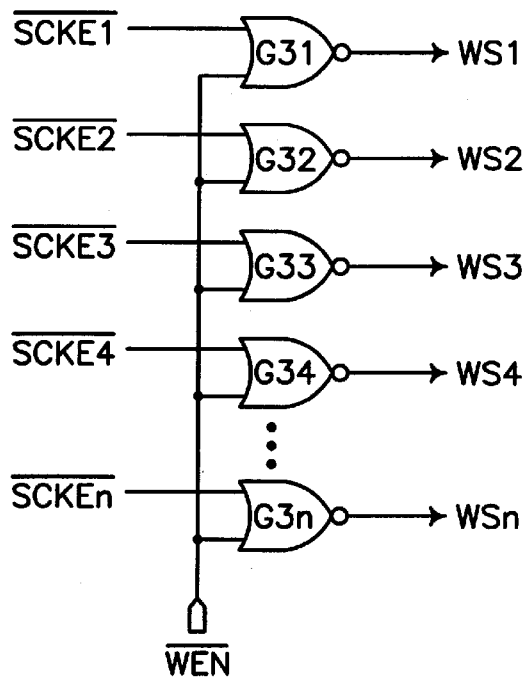
FIG. 4 is a schematic detailed circuit diagram of the second decoder of FIG. 1.
Figure 4:
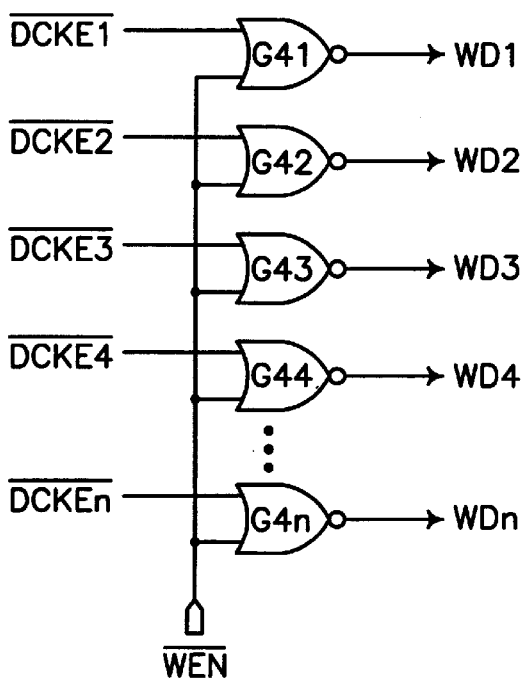

A detailed circuit construction of the second decoder 190 according to one embodiment of the invention is illustrated in FIG. 4. The decoder 190 includes a first group of NOR gates G31, G32, ..., and G3n and a second group of NOR gates G41, G42, ..., and G4n. First inputs of the NOR gates G31, G32, ..., and G3n are commonly coupled to the write enable signal $\overline{WEN}$ and second inputs thereof are coupled to the clock enable signals $\overline{SCKE1-SCKEn}$, respectively. The NOR gates G31, G32, ..., and G3n perform logical function of the signals $\overline{WEN}$ and $\overline{SCKE1-SCKEn}$ and generate logical outputs WS1, WS2, ..., and WSn as the decoding signals for the SDR burst write operation. Similarly, first inputs of the NOR gates G41, G42, ..., and G4n are commonly coupled to the write enable signal $\overline{\text{WEN}}$ and second inputs thereof are coupled to the clock enable signals $\overline{\text{DCKE1}}$–$\overline{\text{DCKEn}}$, respectively. The NOR gates G41. G42, . . . , and G4n perform logical function of the signals $\overline{\text{WEN}}$ and $\overline{\text{DCKE1}}$–$\overline{\text{DCKEn}}$ and generate logical outputs WD1, WD2, . . . , and WDn as the decoding signals for the DDR burst write operation. Although the first and second decoders are described as being implemented with NOR gates by use of the signals $\overline{\text{REN}}$ and $\overline{\text{WEN}}$, it is apparent to one skilled in the art that the decoders can be implemented with other logic circuits (e.g., NAND gates and inverters) by using the signals REN and WEN.

Figure 5:
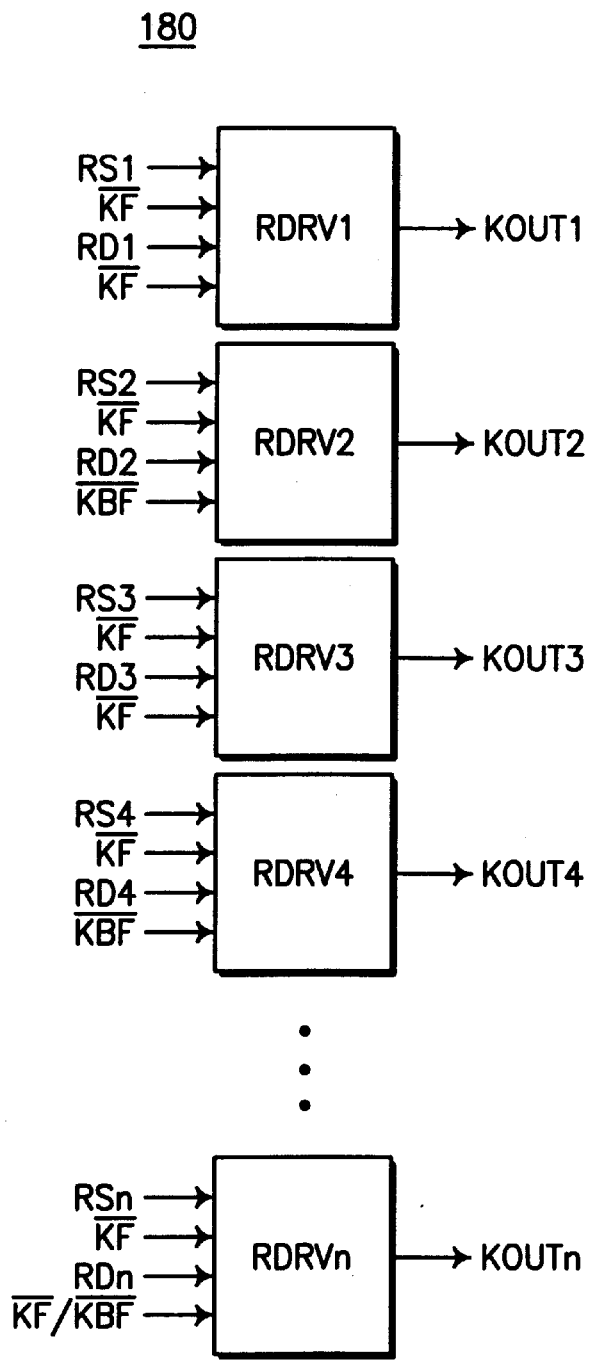
FIG. 5 is a schematic block diagram of the first clock driver of FIG. 1.
Figure 6:
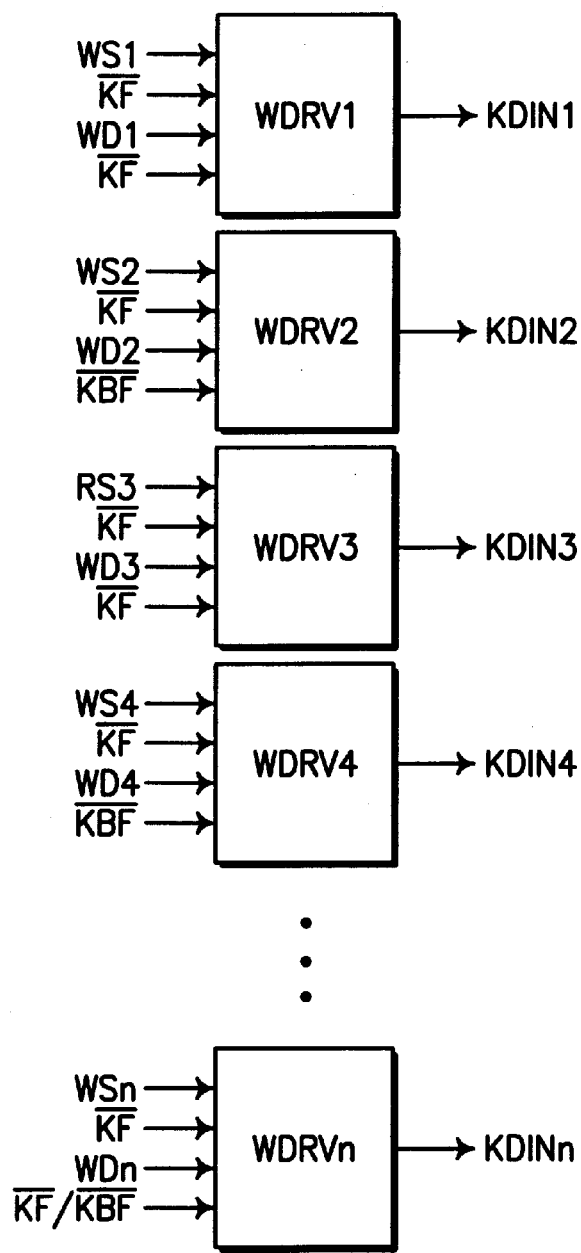
FIG. 6 is a schematic block diagram of the second clock driver of FIG. 1.

FIG. 5 illustrates the first clock driver 180, and FIG. 6 illustrates the second clock driver 200 according to one embodiment of the invention. The first clock driver 180 includes a plurality of unit drivers RDRV1, RDRV2, . . . , and RDRVn, as can be seen from FIG. 5. Each unit driver RDRVk (k=1, 2, . . . , or n) has four inputs and one output. First inputs of the unit drivers RDRV1, RDRV2, . . . , and RDRVn are provided with the decoding signals RS1, RS2, . . . , and RSn from the first decoder 170, respectively, second inputs thereof with the first detection signal $\overline{\text{KF}}$ from the clock edge detector 130, and third inputs thereof with the decoding signals RD1, RD2, . . . , and RDn from the decoder 170, respectively. Fourth inputs of the odd-numbered unit drivers RDRV1, RDRV3, . . . are provided with the detection signal $\overline{\text{KF}}$, and those of the even-numbered unit drivers RDRV2, RDRV4, . . . are provided with the second detection signal $\overline{\text{KBF}}$ from the detector 130. In FIG. 5, if n is an odd number, then the fourth input of the unit driver RDRVn receives $\overline{\text{KF}}$, but if not, it receives $\overline{\text{KBF}}$.

As can be seen in FIG. 6, the second clock driver 200 also includes a plurality of unit drivers WDRV1, WDRV2, . . . , WDRVn. Each unit driver WDRVk (k=1, 2, . . . , or n) has four inputs and one output. First inputs of the unit drivers WDRV1, WDRV2, . . . , and WDRVn are provided with the decoding signals WS1, WS2, . . . , and WSn from the second decoder 190, respectively, second inputs thereof with the first detection signal $\overline{\text{KF}}$ from the clock edge detector 130, and third inputs thereof with the decoding signals WD1, WD2, . . . , and WDn from the decoder 190, respectively. Fourth inputs of the odd-numbered unit drivers WDRV1, WDRV3, . . . are provided with the detection signal $\overline{\text{KF}}$, but those of the even-numbered unit drivers WDRV2, WDRV4, . . . are provided with the second detection signal $\overline{\text{KBF}}$ from the detector 130. In FIG. 6, if n is an odd number, then the fourth input of the unit driver WDRVn receives $\overline{\text{KF}}$, but if not, it receives $\overline{\text{KBF}}$.

Figure 7:
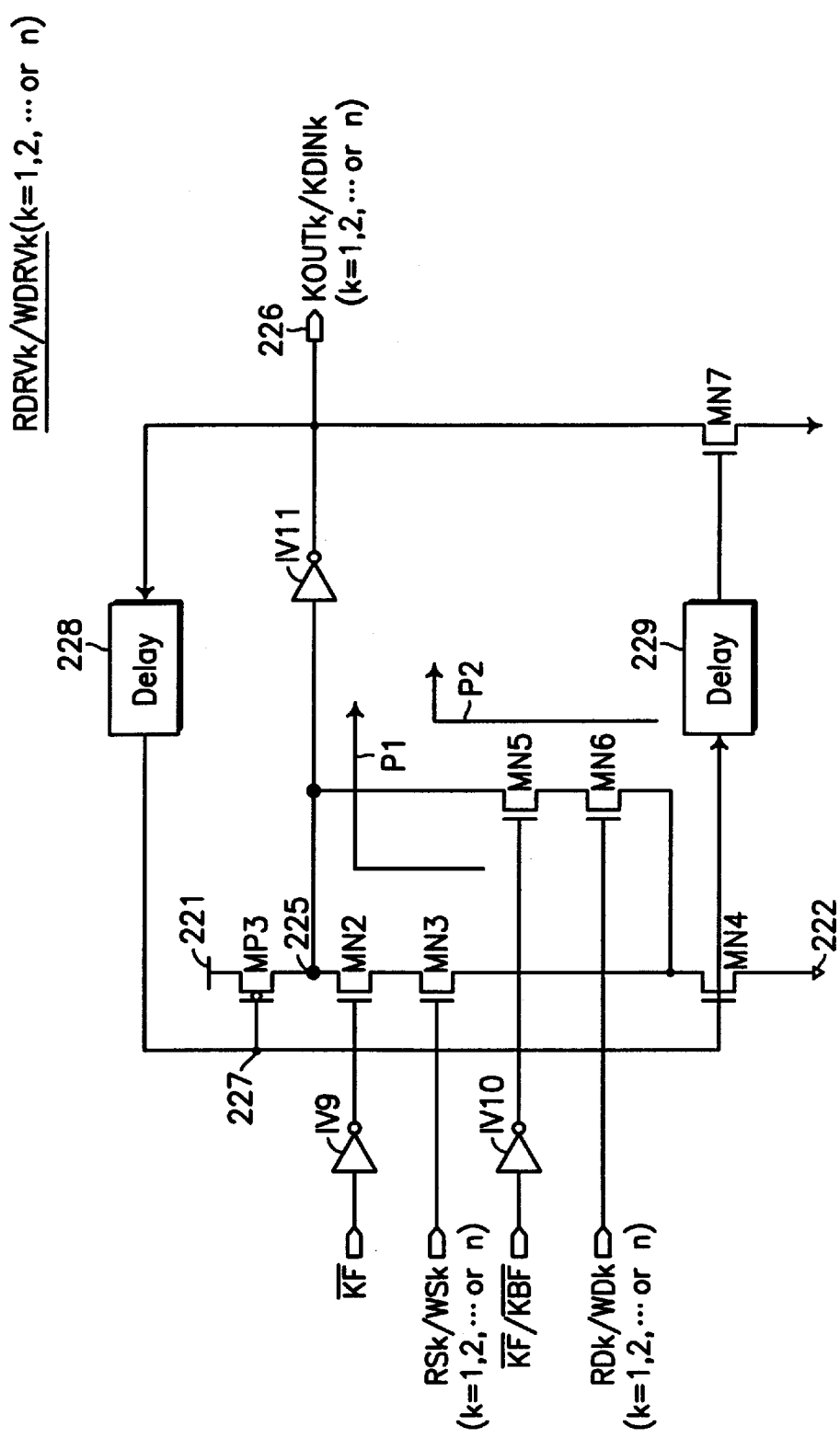
FIG. 7 is a detailed schematic circuit diagram of a unit driver shown in FIGS. 5 and 6.

FIG. 7 illustrates a detailed circuit construction of one embodiment of the respective unit driver RDRVk or WDRVk (k=1, 2, . . . , or n) of FIGS. 5 and 6. As can be seen in FIG. 7, the unit driver has a dynamic circuit construction and includes inverters IV9, IV10, and IV11, a P-channel MOS transistor MP3, N-channel MOS transistors MN2, MN3, MN4, MN5, MN6 and MN7, and two inverting delays 228 and 229. The source-drain conduction paths of the transistors MP3, MN2, MN3 and MN4 are coupled in series between the power supply voltage 221 and the ground voltage 222, and form a first control path P1 for the SDR mode. The conduction paths of the transistors MN5 and MN6 are coupled in series between the drain junction 225 of the transistors MP3 and MN2 and the source-drain junction of the transistors MN3 and NN4, and form a second control path P2 for the DDR mode.

The decoding signal RSk or WSk (k=1, 2, . . . , or n) is applied to the gate of the transistor MN3, i.e., the first input of the unit driver. The detection signal $\overline{\text{KF}}$ is applied to the input of the inverter IV9, i.e., the second input of the unit driver. The decoding signal RDk or WDk (k=1, 2, . . . , or n) is applied to the gate of the transistor MN6, i.e., the third input of the unit driver. The detection signal $\overline{\text{KF}}$ (if k is an odd number) or $\overline{\text{KBF}}$ (if k is an even number) is applied to the input of the inverter IV10 i.e., the fourth input of the unit driver. The outputs of the inverters IV9 and IV10 are coupled to the gates of the transistors MN2 and MN5, respectively. The inverter IV11 is coupled between the node 225 and an output node 226, i.e., the output of the unit drivers for outputting the data output/input strobe clock signal KOUTk or KDINk (k=1, 2, . . . , or n). The delay 228 has an input coupled to the node 226 and an output coupled through the gates of the transistors MP3 and MN4 to an input of the delay 229. The delay 228 delays the logic level on the node 226 and outputs the inverted logic level on the node 226. The transistor MN7 has a source-drain conduction path coupled between the node 226 and the ground voltage 222, and a gate coupled to an output of the delay 229. The delay 229 delays the logic level on the node 227 and outputs the inverted logic level on the node 227.

For example, if the data output/input strobe signal KOUT1 or KDIN1 remains inactive, i.e., low, after a predetermined time elapse by the delay 228, the transistor MP3 is turned off and the transistor MN4 is turned on. At this time, if the signal RS1 or WS1 goes active, i.e., high, in SDR mode, the transistor MN3 is turned on. Thereafter, when the detection signal $\overline{\text{KF}}$ goes active, i.e., low, the transistor MN2 is turned on and thus the data output/input strobe signal KOUT1 or KDIN1 becomes active, i.e., high. Alternatively, if the signal RD1 or WD1 goes active, i.e., high, in DDR mode, the transistor MN6 is turned on. Thereafter, when the detection signal $\overline{\text{KF}}$ or $\overline{\text{KBF}}$ goes active, i.e., low, the transistor MN5 is turned on and thus the data output/input strobe signal KOUT1 or KDIN1 becomes active, i.e., high.

When the data output/input strobe signal KOUT1 or KDIN1 remains active, i.e., high, the transistor MP3 is turned on and the transistor MN4 is turned off after the predetermined delay time by the delay 228. Thereafter, when a predetermined time by the delay 229 elapses, the transistor MN7 is turned on. As a result, the data output/input strobe signal KOUT1 or KDIN1 becomes inactive, i.e., low.

As described above, according to the synchronous burst semiconductor memory device of the invention, data-in and/or data-out buffer is adaptively clocked depending upon the burst length. Further, input/output data strobe clocks are adaptively generated depending upon the input/output data rate. Further, an enough timing margin in the double data rate mode can be acquired.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A synchronous burst semiconductor memory device operating in synchronism with at least one external clock signal and capable of accessing data on every edge of the external clock signal, the memory device comprising:

a clock generator responsive to a plurality of input information signals, for generating a number of output strobe clock signals in synchronism with the external clock signal, wherein the output strobe clock signals become activated in turn in a single data rate mode where each data word is driven in synchronism with alternating edges of the external clock signal and in a double data rate mode where each data word is driven in synchronism with every edge of the external clock signal; and a data buffer for outputting internal data in synchronism with the output strobe clock signals.

2. The memory device according to claim 1, wherein, in the single data rate mode, each data word is driven in synchronism with every rising edge of the external clock signal.

3. The memory device according to claim 1, wherein, in the single data rate mode, each data word is driven in synchronism with every falling edge of the external clock signal.

4. The memory device according to claim 1, wherein the number of the activated output strobe clocks depends on a burst length of a burst read operation.

5. A synchronous burst semiconductor memory device operating in synchronism with at least one external clock signal and capable of accessing data on every edge of the external clock signal, the memory device comprising:

a clock generator responsive to a plurality of input information signals, for generating a number of input strobe clock signals in synchronism with the external clock signal, wherein the input strobe clock signals become activated in turn in a single data rate mode where each data word is driven in synchronism with alternating edges of the external clock signal and in a double data rate mode where each data word is driven in synchronism with every edge of the external clock signal; and a data buffer for inputting external data in synchronism with the input strobe clock signals.

6. The memory device according to claim 5, wherein, in the single data rate mode, each data word is driven in synchronism with every rising edge of the external clock signal.

7. The memory device according to claim 5, wherein, in the single data rate mode, each data word is driven in synchronism with every falling edge of the external clock signal.

8. The memory device according to claim 5, wherein the number of the activated input strobe clock signals depends on a burst length of a burst write operation.

9. A synchronous burst semiconductor memory device operating in synchronism with a pair of external clock signals being complementary to each other and capable of accessing data on every edge of the external clock signals, the memory device comprising:

a clock generator responsive to a plurality of input information signals, for generating a number of output strobe clock signals and a number of input strobe clock signals in synchronism with the external clock signals, wherein the output and input strobe clock signals become activated in turn in a single data rate mode where each data word is driven in synchronism with alternating edges of the external clock signals and in a double data rate mode where each data word is driven in synchronism with every edge of the external clock signals;

a first data buffer for outputting internal data in synchronism with the output strobe clock signals; and a second data buffer for inputting external data in synchronism with the input strobe clock signals.

10. The memory device according to claim 9, wherein, in the single data rate mode, each data word is driven in synchronism with every rising edge of the external clock signal.

11. The memory device according to claim 9, wherein, in the single data rate mode, each data word is driven in synchronism with every falling edge of the external clock signal.

12. The memory device according to claim 9, wherein the number of the activated output/input strobe clock signals depends on a burst length of a burst read/write operation.

13. A synchronous burst semiconductor memory device operating in synchronism with at least one external clock signal and capable of accessing data on every edge of the external clock signal, the memory device comprising:

a clock edge detector for detecting both rising edges and falling edges of the external clock signal to generate first and second detection signals indicating the rising edges and the falling edges, respectively;

a burst access type controller for generating first through third access type control signals in response to external access type input signals, the first through third access type signals indicating a read enable period, a write enable period and a burst continue period, respectively;

a data rate controller for generating first and second data rate signals in response to an external data rate input;

a clock enable signal generator responsive to the detection signals, the access type signals and the data rate signals, for generating a plurality of first clock enable signals for a first data rate mode where each data word is driven in synchronism with every rising/falling edge of the external clock signals and a plurality of second clock enable signals for a second data rate mode where each data word is driven in synchronism with every edge of the external clock signal, the first and second clock enable signals becoming activated in turn depending on a burst length of a burst read operation;

a decoder for decoding the first control signal, the first clock enable signals, and the second clock enable signals to generate a number of first decoding signals for the first data rate mode and a number of second decoding signals for the second data rate mode, the first and second decoding signals becoming activated in turn, the numbers of the first and second decoding signals depending on the burst length;

a clock driver responsive to the first and second detection signals, the first decoding signals and the second decoding signals, for generating a number of strobe clock signals, the strobe clock signals becoming activated in turn; and a data-out buffer for outputting internal data in synchronism with the first strobe clock signals.

14. The memory device according to claim 13, wherein the number of the activated output strobe clock signals depends on the burst length.

15. A synchronous burst semiconductor memory device operating in synchronism with at least one external clock signal and capable of accessing data on every edge of the external clock signal, the memory device comprising:

a clock edge detector for detecting both rising edges and falling edges of the external clock signal to generate first and second detection signals indicating the rising edges and the falling edges, respectively;

a burst access type controller for generating first through third access type control signals in response to external access type input signals, the first through third access type signals indicating a read enable period, a write enable period and a burst continue period, respectively;

a data rate controller for generating first and second data rate signals in response to an external data rate input;

a clock enable signal generator responsive to the detection signals, the access type signals and the data rate signals, for generating a plurality of first clock enable signals for a single data rate (SDR) mode where each data word is driven in synchronism with every rising/falling edge of the external clock signals and a plurality of second clock enable signals for a double data rate (DDR) mode where each data word is driven in synchronism with every edge of the external clock signal, the first and second clock enable signals becoming activated in turn depending on a burst length of a burst write operation;

a decoder for decoding the second control signal, the first clock enable signals and the second clock enable signals to generate a number of first decoding signals for the first data rate mode and a number of second decoding signals for the second data rate mode, the first and second decoding signals becoming activated in turn, the numbers of the first and second decoding signals depending on the burst length;

a clock driver responsive to the first and second detection signals, the first decoding signals and the second decoding signals, for generating a number of strobe clock signals, the strobe clock signals becoming activated in turn; and a data-in buffer for inputting external data in synchronism with the strobe clock signals.

16. The memory device according to claim 15, wherein the number of the activated input strobe clock signals depends on the burst length.

17. A synchronous burst semiconductor memory device operating in synchronism with a pair of first and second external clock signals being complementary to each other and capable of accessing data on every edge of the external clock signals, the memory device comprising:

a clock edge detector for detecting rising/falling edges of the first and second external clock signals to generate first and second detection;

a burst access type controller for generating first and third access type control signals in response to external access type input signals, the first through third access type signals indicating a read enable period, a write enable period and a burst continue period, respectively;

a data rate controller for generating first and second data rate signals in response to an external data rate input;

a clock enable signal generator responsive to the detection signals, the access type signals and the data rate signals, for generating a plurality of first clock enable signals for a single data rate (SDR) mode and a plurality of second clock enable signals for a double data rate (DDR) mode, the first and second clock enable signals becoming activated in turn depending on a burst length of either a burst read operation or a burst write operation, wherein each data word is driven in synchronism with every rising/falling edge of the external clock signals in the first data rate mode and each data word is driven in synchronism with every edge of the external clock signals in the second data rate mode;

a first decoder for decoding the first control signal, the first clock enable signals, and the second clock enable signals to generate a number of first decoding signals for the first data rate mode and a number of second decoding signals for the second data rate mode, the first and second decoding signals becoming activated in turn, the numbers of the first and second decoding signals depending on the burst length of the burst read operation;

a first clock driver responsive to the first and second detection signals, the first decoding signals and the second decoding signals, for generating a number of first strobe clock signals, the first strobe clock signals becoming activated in turn;

a data-out buffer for outputting internal data in synchronism with the first strobe clock signals;

a second decoder for decoding the second control signal, the first clock enable signals and the second clock enable signals to generate a number of third decoding signals for the first data rate mode and a number of fourth decoding signals for the second data rate mode, the third and fourth decoding signals becoming activated in turn, the numbers of the third and fourth decoding signals depending on the burst length of the burst write operation;

a second clock driver responsive to the first and second detection signals, the third decoding signals and the fourth decoding signals, for generating a number of second strobe clock signals, the second strobe clock signals becoming activated in turn;

a data-in buffer for inputting external data in synchronism with the second strobe clock signals.

18. The memory device according to claim 17, wherein the numbers of the activated output and input strobe clock signals depend on the burst lengths of the burst read and write operations, respectively.

19. The memory device according to claim 17, wherein the clock enable signal generator comprises a plurality of switch elements and a plurality of signal latches.

20. The memory device according to claim 17, wherein the first and second decoders each comprises a plurality of logic gates.

21. A synchronous burst semiconductor memory device comprising:

a clock generator responsive to an external clock signal for generating a plurality of output strobe clock signals in response to the external clock signal, wherein the output strobe clock signals are activatable in a single data rate mode to drive data words in response to alternate edges of the external clock signal and the output strobe clock signals are activatable in a double data rate mode to drive data words in response to consecutive edges of the external clock signal; and a data buffer by which internal data words are output from the memory device in response to the output strobe clock signals.

22. The memory device according to claim 21, wherein, in the single data rate mode, each data word is driven in synchronism with every rising edge of the external clock signal.

23. The memory device according to claim 21, wherein, in the single data rate mode, each data word is driven in synchronism with every falling edge of the external clock signal.

24. The memory device according to claim 21, wherein the number of the activated output strobe clock signals depends on a burst length of a burst read operation.

25. A synchronous burst semiconductor memory device comprising:

a clock generator responsive to an external clock signal for generating a plurality of input strobe clock signals in response to the external clock signal, wherein the input strobe clock signals are activatable in a single data rate mode to drive data words in response to alternate edges of the external clock signal and the input strobe clock signals are activatable in a double data rate mode to drive data words in response to consecutive edges of the external clock signal; and a data buffer by which external data words are input to the memory device in response to the input strobe clock signals.

26. The memory device according to claim 25, wherein, in the single data rate mode, each data word is driven in synchronism with every rising edge of the external clock signal.

27. The memory device according to claim 25, wherein, in the single data rate mode, each data word is driven in synchronism with every falling edge of the external clock signal.

28. The memory device according to claim 25, wherein the number of activated input strobe clock signals depends on a burst length of a burst write operation.

29. A synchronous burst semiconductor memory device comprising:

a clock generator responsive to at least two external clock signals being complementary to each other for generating a plurality of output strobe clock signals and a plurality of input strobe clock signals in response to the external clock signals, wherein the output strobe clock signals are activatable in a single data rate mode to drive data words in response to alternate edges of one of the external clock signals, and the output strobe clock signals are activatable in a double data rate mode to drive data words in response to consecutive edges of the one of the external clock signals, and the input strobe clock signals are activatable in the single data rate mode to drive data words in response to alternate edges of the other of the external clock signals, and the input strobe clock signals are activatable in the double data rate mode to drive data words in response to consecutive edges of the other of the external clock signals;

a first data buffer by which internal data words are output from the memory device in response to the output strobe clock signals; and a second data buffer by which external data words are input to the memory device in response to the input strobe clock signals.

30. The memory device according to claim 29, wherein, in the single data rate mode, each data word is driven in synchronism with every rising edge of one of the external clock signal.

31. The memory device according to claim 29, wherein, in the single data rate mode, each data word is driven in synchronism with every falling edge of one of the external clock signal.

32. The memory device according to claim 29, wherein the number of activated output/input strobe clock signals depends on a burst length of a burst read/write operation.

* * * * *